United States Patent
Bao et al.

(10) Patent No.: US 10,770,568 B2
(45) Date of Patent: Sep. 8, 2020

(54) METHOD TO REMOVE III-V MATERIALS IN HIGH ASPECT RATIO STRUCTURES

(71) Applicant: Applied Materials, Inc., Santa Clara, CA (US)

(72) Inventors: Xinyu Bao, Fremont, CA (US); Ying Zhang, Santa Clara, CA (US); Qingjun Zhou, San Jose, CA (US); YungChen Lin, Los Angeles, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/277,634

(22) Filed: Feb. 15, 2019

(65) Prior Publication Data
US 2019/0181246 A1    Jun. 13, 2019

Related U.S. Application Data

(63) Continuation-in-part of application No. 15/811,188, filed on Nov. 13, 2017, now Pat. No. 10,269,647.
(Continued)

(51) Int. Cl.
*H01L 29/66*    (2006.01)
*H01L 21/02*    (2006.01)
(Continued)

(52) U.S. Cl.
CPC .... *H01L 29/66795* (2013.01); *H01L 21/0243* (2013.01); *H01L 21/823431* (2013.01);
(Continued)

(58) Field of Classification Search
None
See application file for complete search history.

(56) References Cited

U.S. PATENT DOCUMENTS 10,269,647 B2 *  4/2019  Zhang ............. H01L 21/823431
2012/0091528 A1  4/2012  Chang et al.
(Continued)

FOREIGN PATENT DOCUMENTS

KR    10-2016-0130524 A    11/2016
WO    2016190858 A1         12/2016

OTHER PUBLICATIONS

PCT Notification of Transmittal of the International Search Report and the Written Opinion of the International Searching Authority for International Application No. PCT/US2018/012968; dated May 8, 2018; 10 total pages.
(Continued)

*Primary Examiner* — Asok K Sarkar
(74) *Attorney, Agent, or Firm* — Patterson + Sheridan, LLP (57) ABSTRACT

Methods for forming semiconductor devices, such as Fin-FETs, are provided. In an embodiment, a fin structure processing method includes removing a portion of a first fin of a plurality of fins formed on a substrate to expose a surface of a remaining portion of the first fin, wherein the fins are adjacent to dielectric material structures formed on the substrate; performing a deposition operation to form features on the surface of the remaining portion of the first fin by depositing a Group III-V semiconductor material in a substrate processing environment; and performing an etching operation to etch the features with an etching gas to form a plurality of openings between adjacent dielectric material structures, wherein the etching operation is performed in the same chamber as the deposition operation.

20 Claims, 9 Drawing Sheets

Related U.S. Application Data (60) Provisional application No. 62/662,008, filed on Apr. 24, 2018, provisional application No. 62/448,886, filed on Jan. 20, 2017.

(51) Int. Cl.
*H01L 29/06* (2006.01)
*H01L 21/8234* (2006.01)
*H01L 27/088* (2006.01)
*H01L 21/762* (2006.01)

(52) U.S. Cl.
CPC ...... *H01L 27/0886* (2013.01); *H01L 29/0649* (2013.01); *H01L 21/76224* (2013.01)

(56) References Cited

U.S. PATENT DOCUMENTS

| | | |
|---|---|---|
| 2014/0001520 A1 | 1/2014 | Glass et al. |
| 2014/0273398 A1 | 9/2014 | Holland et al. |
| 2015/0035113 A1* | 2/2015 | Chen ............... H01L 29/0649 |
| | | 257/506 |
| 2015/0171193 A1 | 6/2015 | Cheng et al. |
| 2016/0049516 A1 | 2/2016 | Huang et al. |
| 2016/0149036 A1 | 5/2016 | Huang et al. |
| 2016/0233321 A1 | 8/2016 | Ching et al. |
| 2016/0372470 A1 | 12/2016 | Ok et al. |
| 2017/0098584 A1 | 4/2017 | Bu et al. |
| 2018/0033873 A1 | 2/2018 | Yan et al. |

OTHER PUBLICATIONS

European Search Report for Application No. EP 19168988.4 dated Oct. 9, 2019.

* cited by examiner

METHOD TO REMOVE III-V MATERIALS IN HIGH ASPECT RATIO STRUCTURES

CROSS REFERENCE TO RELATED APPLICATIONS

This application claims benefit of U.S. Provisional Patent Application No. 62/662,008, filed Apr. 24, 2018, the entirety of which is herein incorporated by reference, and is a continuation-in-part of application Ser. No. 15/811,188, filed Nov. 13, 2017, which claims benefit of U.S. Provisional Patent Application Ser. No. 62/448,886, filed Jan. 20, 2017, the entirety of which is herein incorporated by reference.

BACKGROUND

Field

Embodiments of the present invention generally relate to methods for forming semiconductor devices, and more particularly to methods for forming fin field effect transistors (FinFets).

Description of the Related Art

FinFET devices typically include semiconductor fins with high aspect ratios in which the channel and source/drain regions for the transistor are formed thereover. A gate electrode is then formed over and alongside of a portion of the fin devices utilizing the advantage of the increased surface area of the channel and source/drain regions to produce faster, more reliable and better-controlled semiconductor transistor devices. Further advantages of FinFETs include reducing the short channel effect and providing higher current flow.

Conventional techniques for fabricating FinFETs suffer from challenges during removing or trimming of III-V materials such as GaAs, InGaAs, and InP on patterned wafers. Such challenges include selectively etching the III-V semiconductor materials versus Si, $SiO_x$, and $SiN_x$; difficulty in reaching the bottom of the trenches (<30 nm) in high aspect ratio structures; thermal budget limitations; and arsenic contamination and abatement constraints for the substrate processing chamber.

Thus, there is a need for improved methods for fin structure fabrication.

SUMMARY

Methods for forming semiconductor devices, such as FinFETs, are provided. In an embodiment, a fin structure processing method includes removing a portion of a first fin of a plurality of fins formed on a substrate to expose a surface of a remaining portion of the first fin, wherein the fins are adjacent to dielectric material structures formed on the substrate; performing a deposition operation to form features on the surface of the remaining portion of the first fin by depositing a Group III-V semiconductor material in a substrate processing environment; and performing an etching operation to etch the features with an etching gas to form a plurality of openings between adjacent dielectric material structures, wherein the etching operation is performed in the same chamber as the deposition operation.

In another embodiment, a fin structure processing method includes removing a portion of a first fin of a plurality of fins formed on a substrate to expose a surface of a remaining portion of the first fin, wherein the fins are adjacent to dielectric material structures formed on the substrate; performing a deposition operation to form features on the surface of the remaining portion of the first fin by depositing a Group III-V semiconductor material in a substrate processing environment; planarizing the Group III-V semiconductor material by a chemical mechanical polishing process; performing an etching operation to etch the features with an etching gas to form a plurality of openings between adjacent dielectric material structures, wherein the etching operation is performed in the same chamber as the deposition operation; and forming a fill material on the surface of the remaining portion of the first fin, wherein the fill material is formed within a corresponding opening of the plurality of openings.

In another embodiment, a fin structure processing method includes removing a portion of a first fin of a plurality of fins formed on a substrate to expose a surface of a remaining portion of the first fin, wherein the fins are adjacent to dielectric material structures formed on the substrate; performing a deposition operation to form features on the surface of the remaining portion of the first fin by depositing a Group III-V semiconductor material in a substrate processing environment; planarizing the Group III-V semiconductor material by a chemical mechanical polishing process; performing an etching operation to etch the features with an etching gas to form a plurality of openings between adjacent dielectric material structures, wherein the etching operation is performed in the same chamber as the deposition operation and wherein the etching gas is HCl; delivering a hydrogen containing gas, a carrier gas, or a combination thereof, to the substrate processing environment; and forming a fill material on the surface of the remaining portion of the first fin, wherein the fill material is formed within a corresponding opening of the plurality of openings.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
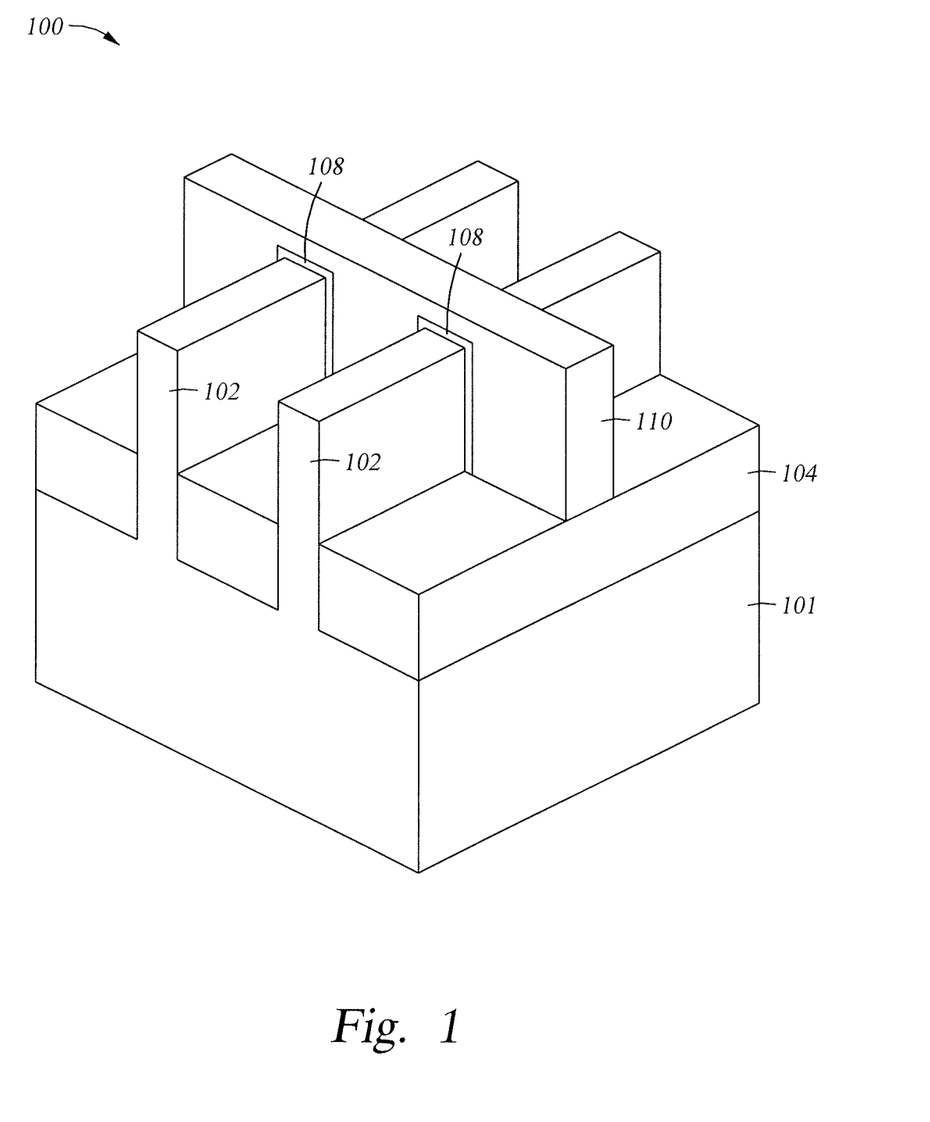
FIG. 1 is a perspective view of a semiconductor structure according to one embodiment described herein.

FIG. 1 is a perspective view of a semiconductor structure 100 according to one embodiment described herein. The semiconductor structure 100 may include a substrate 101, a plurality of fins 102 (only two are shown, but the structure may have more than two fins), a dielectric material 104 disposed between adjacent fins 102 on the substrate 101, and a gate electrode 110 disposed on the dielectric material 104 and over a portion of each fin 102. The substrate 101 may be a bulk silicon substrate, and may be doped with a p-type or an n-type impurity. The substrate 101 may, alternatively, be fabricated from other substrate materials that include germanium, silicon-germanium, and other similar materials. The plurality of fins 102 may be fabricated from the same material as the substrate 101. The dielectric material 104 may form isolation regions, such as shallow trench isolation (STI) regions, and may be fabricated from silicon oxide, silicon nitride, silicon oxynitride, silicon carbonitride, or any other suitable dielectric material. As shown in FIG. 1, each of the plurality of fins 102 extends a distance above the upper surface of the dielectric material 104. A gate dielectric 108 is formed between the gate electrode 110 and the plurality of fins 102. The gate dielectric 108 facilitates electrical isolation between the gate electrode 110 and the plurality of fins 102. The gate dielectric 108 may be fabricated from silicon nitride, silicon oxide, hafnium oxide, hafnium silicon oxynitride, hafnium silicate, hafnium silicon oxide, or any other suitable gate dielectric material. The gate electrode 110 may be fabricated from polysilicon, amorphous silicon, germanium, silicon germanium, metals, or metal alloys.

Figure 2A:
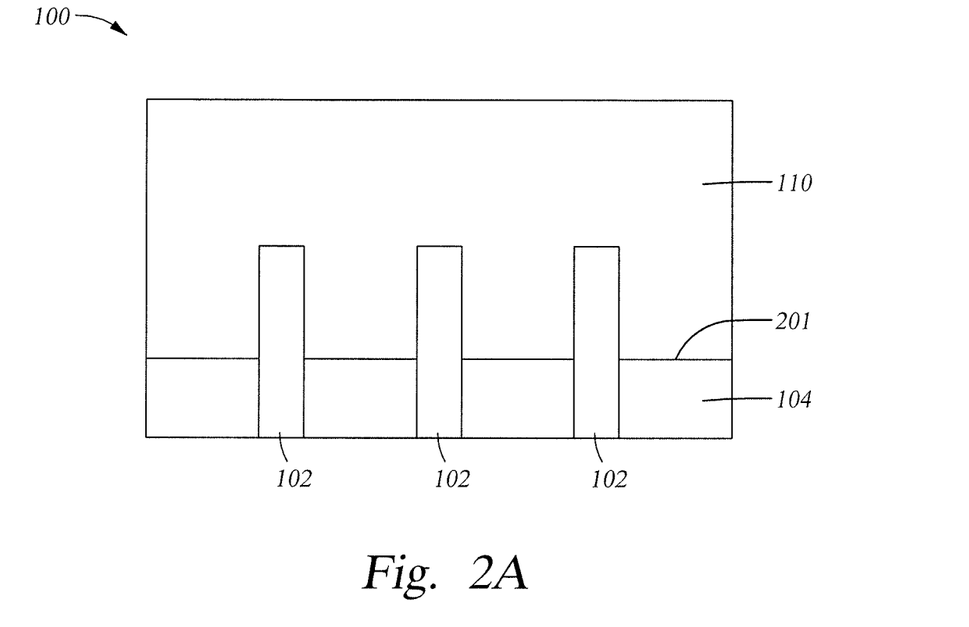
FIGS. 2A-2H illustrate a process for forming a semiconductor device according to one embodiment described herein.
Figure 2B:
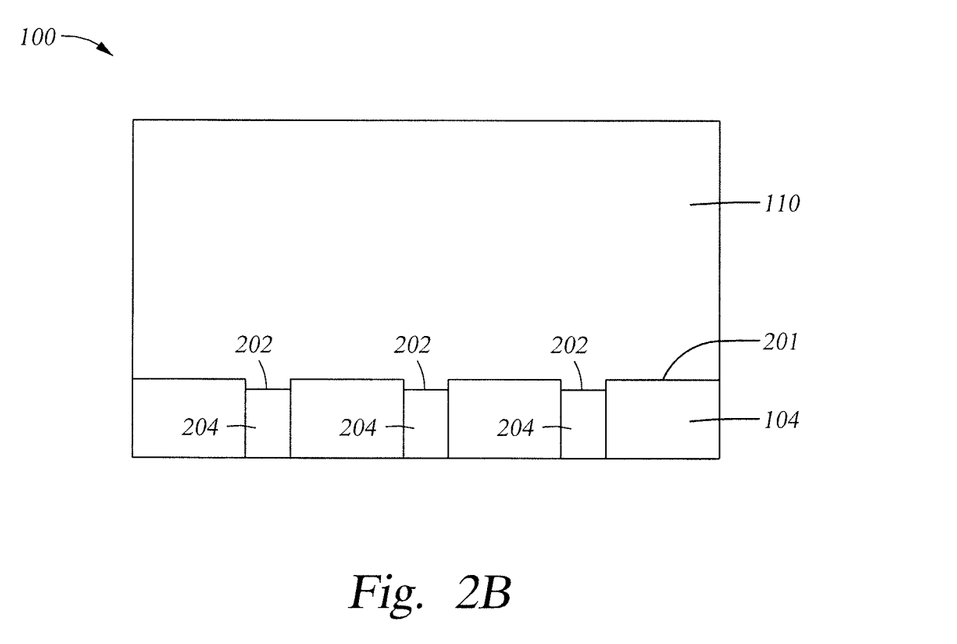

FIGS. 2A-2H illustrate a process for forming a semiconductor device according to one embodiment described herein. FIG. 2A is a side view of the semiconductor structure 100. The semiconductor structure 100 includes the plurality of fins 102 (three are shown) extending over an upper surface 201 of the dielectric material 104 and the gate electrode 110. The gate dielectric 108 and the substrate 101 are omitted for clarity. Next, as shown in FIG. 2B, a portion of each fin 102 is removed to expose a surface 202 of a remaining portion 204 of the fin 102. The removal of the portion of each fin 102 may be by a selective etching process, as discussed below, so the gate electrode 110 and the dielectric material 104 are not significantly affected by the removal of the portion of the fins 102. In other words, the etch chemistry is chosen such that the etch rate of the fin 102 is much faster than the etch rates of the gate electrode 110 and the dielectric material 104 since the fin 102, the gate electrode 110, and the dielectric material 104 are made of different materials. The surface 202 of the remaining portion 204 of each fin 102 is recessed from the upper surface 201 of the dielectric material.

Figure 2C:
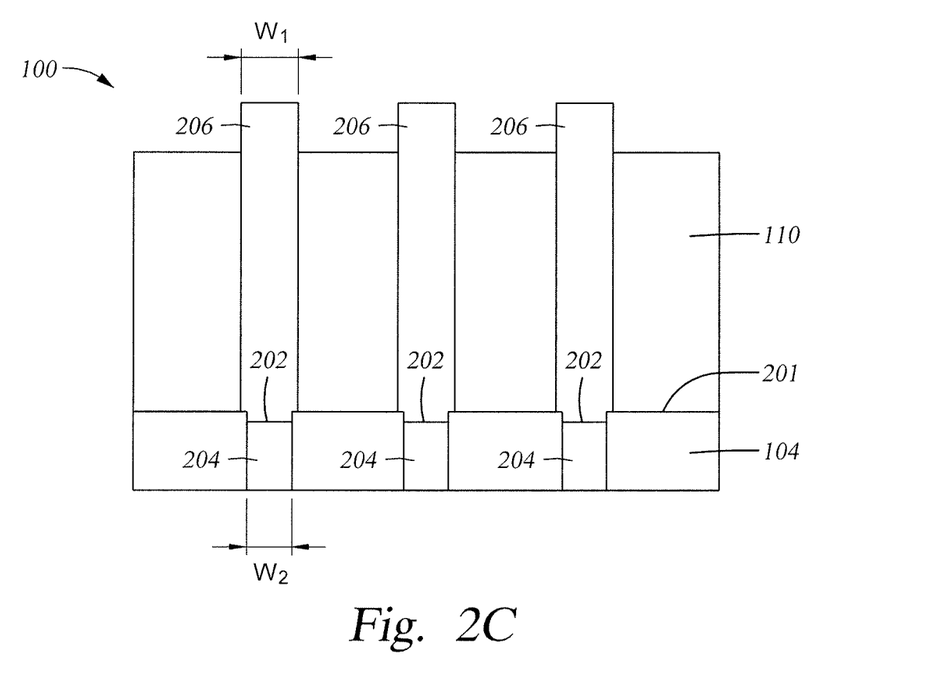

As shown in FIG. 2C, a feature 206, such as a pillar or a ridge, is formed on the surface 202 of the remaining portion 204 of each fin 102. In the view of FIG. 2C, the features 206 appear in the foreground, while the gate electrode 110 appears in the background. Prior to forming the features 206, any native oxides formed on the surfaces 201 and 202 may be removed by a pre-clean process. The features 206 may be formed in an epitaxial deposition chamber, such as a III-V growth chamber. One suitable apparatus for performing epitaxial deposition is the CENTURA™ RP Epi platform available from Applied Materials, Inc., Santa Clara, Calif. In one embodiment, each feature 206 is formed in by first forming a nucleation layer on the surface 202 of the remaining portion 204 of each fin 102. The substrate 101 (FIG. 1) is held at a temperature ranging from about 300 degrees Celsius to about 400 degrees Celsius and the epitaxial deposition chamber may have a pressure less than about 100 Torr during the formation of the nucleation layer. The nucleation layer may have a thickness ranging from about 50 Angstroms to about 100 Angstroms. After the formation of the nucleation layers, the substrate 101 (FIG. 1) is heated to a temperature ranging from about 500 degrees Celsius to about 600 degrees Celsius, the pressure of the epitaxial deposition chamber is reduced to from about 10 Torr to about 40 Torr, and the features 206 are formed. The materials used to form the nucleation layers and the features 206 include Group III-V semiconductor materials such as aluminum antimonide, aluminum arsenide, aluminum gallium arsenide, aluminum gallium indium phosphide, aluminum gallium nitride, aluminum gallium phosphide, aluminum indium arsenide, aluminum nitride, aluminum phosphide, boron arsenide, boron nitride, boron phosphide, gallium antimonide, gallium arsenide, gallium arsenide phosphide, gallium phosphide, gallium arsenide antimonide, indium antimonide, indium arsenide, indium arsenide antimonide, indium gallium arsenide, indium gallium nitride, indium gallium phosphide, indium nitride, and indium phosphide, among others, and combinations thereof. Thus, the features and nucleation layers may be formed by epitaxially depositing a III-V semiconductor material.

Unlike the silicon or germanium based stressor materials, which form a diamond shape due to the different growth rate on different surface planes, the materials used to form the features 206 do not form a diamond shape. The height, width and facets of the features 206 can be controlled by temperature, pressure and/or precursor flow. As shown in FIG. 2C, each feature 206 may have a rectangular cross-section and a substantially constant width $W_1$ over the surface 201 of the remaining portion 204 of each fin 102. The width $W_1$ may be greater than a width $W_2$ of the remaining portion 204 of the fin 102. In one embodiment, the width $W_1$ is about 1 nm to about 10 nm wider than the width $W_2$.

Figure 2D:
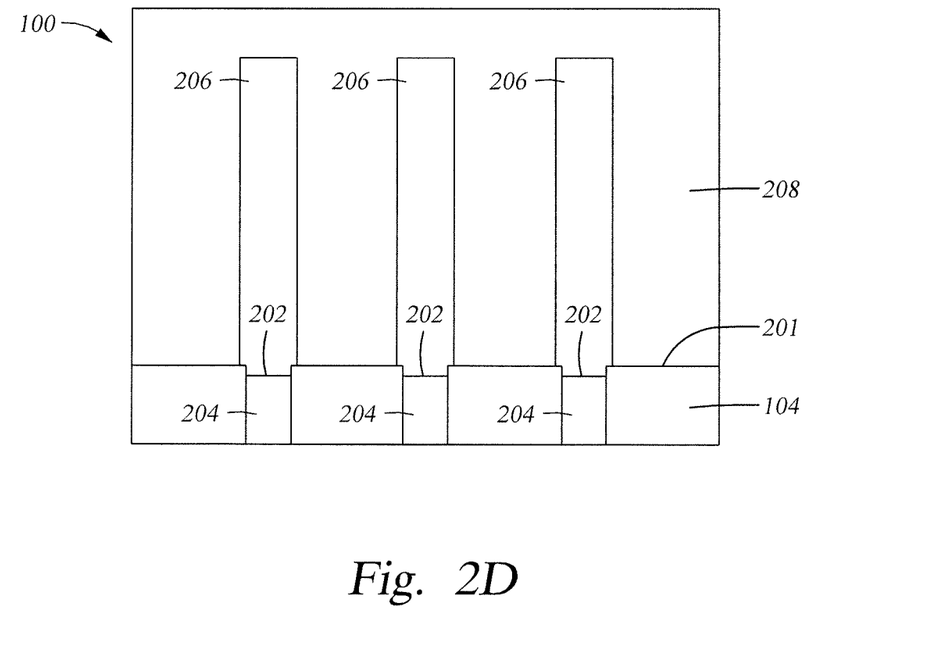
Figure 2E:
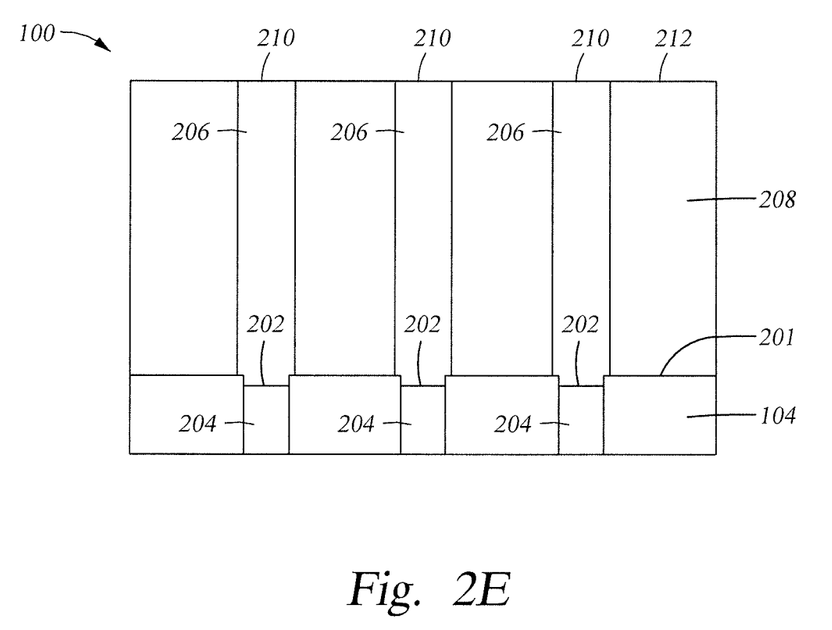

Next, as shown in FIG. 2D, a dielectric material 208 is formed between adjacent features 206. In one embodiment, the dielectric material 208 and the features 206 are coplanar at the end of the deposition process of the dielectric material 208. In another embodiment, the dielectric material 208 is also formed on the features 206 and the gate electrode 110. The dielectric material 208 may be the same material as the dielectric material 104. In one embodiment, the dielectric material 208 is silicon oxide and is deposited by a flowable chemical vapor deposition (FCVD) process. A chemical mechanical planarization (CMP) process is then performed on the dielectric material 208 to expose the features 206, as shown in FIG. 2E. A surface 210 of each feature 206 is exposed, and the surfaces 210 are coplanar with a surface 212 of the dielectric material 208.

Figure 2F:
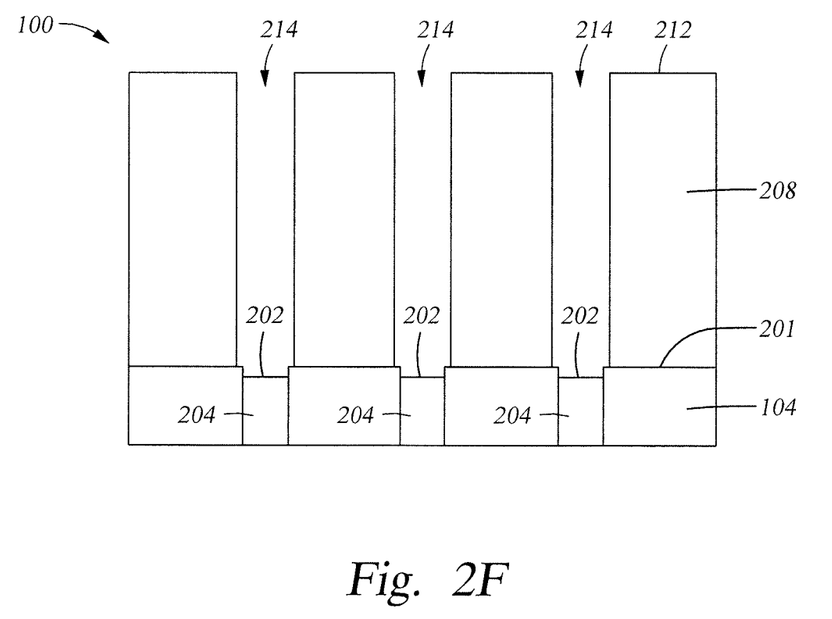
Figure 2G:
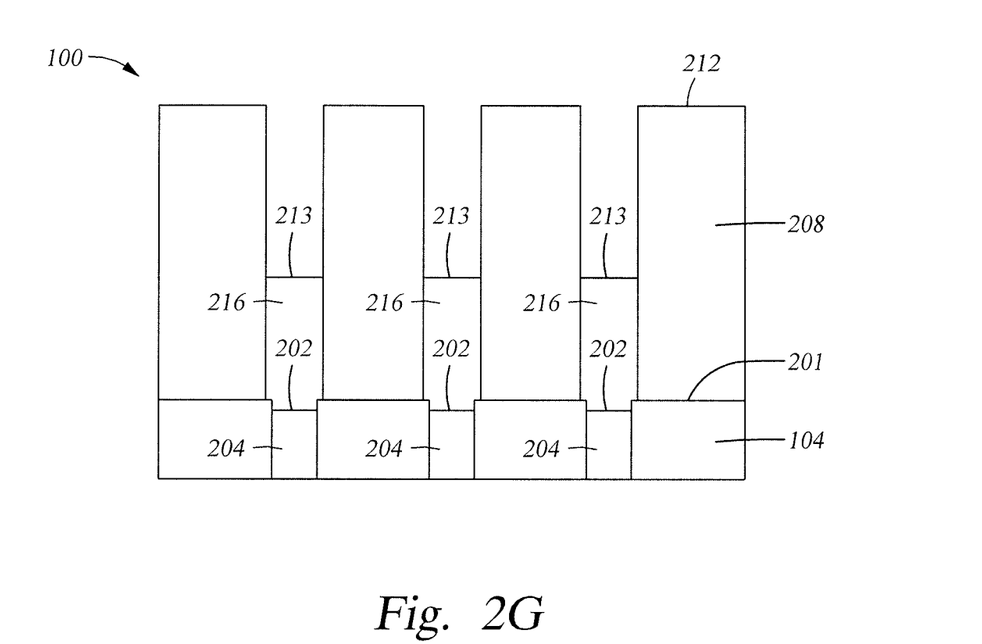

Next, as shown in FIG. 2F, the features 206 are removed to expose the surfaces 202 of the remaining portions 204. The gate dielectric 108 and the gate electrode 110 should appear in the background but are omitted for clarity. The features 206 may be removed by a selective etching process so the dielectric material 208 is not substantially affected. In other words, the etch rate of the feature 206 is much faster than the etch rate of the dielectric material 208 since the feature 206 and the dielectric material 208 are made of different materials. The process for etching is described below. As a result of the removal process, a plurality of openings 214, such as trenches or vias, is formed in the dielectric material 208. Each opening 214 has the same shape as the feature 206. A fill material 216, such as a stressor material, is then deposited in each opening 214 on the surface 202 of the remaining portion 204 of each fin 102, as shown in FIG. 2G. The fill material 216 may be also deposited on the surface 212 of the dielectric material 208, and an etch back process may be performed to remove the fill material 216 deposited on the surface 212 of the dielectric material 208. The fill material 216 may be the source or drain of a FinFET device and may be a silicon and/or germanium based material. In one embodiment, the fill material 216 is an electrically conductive material. The fill material 216 may be formed by an epitaxial deposition process in an epitaxial deposition chamber available from Applied Materials, Inc. The epitaxial deposition process is generally performed by flowing epitaxy precursors such as silane, germane, phosphine, and arsine into the epitaxial deposition chamber and heating the substrate to a temperature, for example 300 degrees Celsius to 600 degrees Celsius, that results in epitaxial deposition on the substrate. For the Group III-V semiconductor materials, precursors for the Group III elements include halides, which can be reacted with materials such as arsine, phosphine, and stilbene. In one embodiment, the fill material 216 is silicon doped with phosphorus and the FinFET device is an n-type FET. In another embodiment, the fill material 216 is silicon germanium doped with boron or gallium, and the FinFET device is a p-type FET. The shape of the fill material 216 is constrained by the opening 214 that the fill material 216 is formed therein. Thus, instead of having a diamond shape, the fill material 216 has a rectangular cross-section, and the distance between adjacent fill materials 216 is increased. Each fill material 216 has a surface 213 that is recessed from the surface 212 of the dielectric material 208.

Figure 2H:
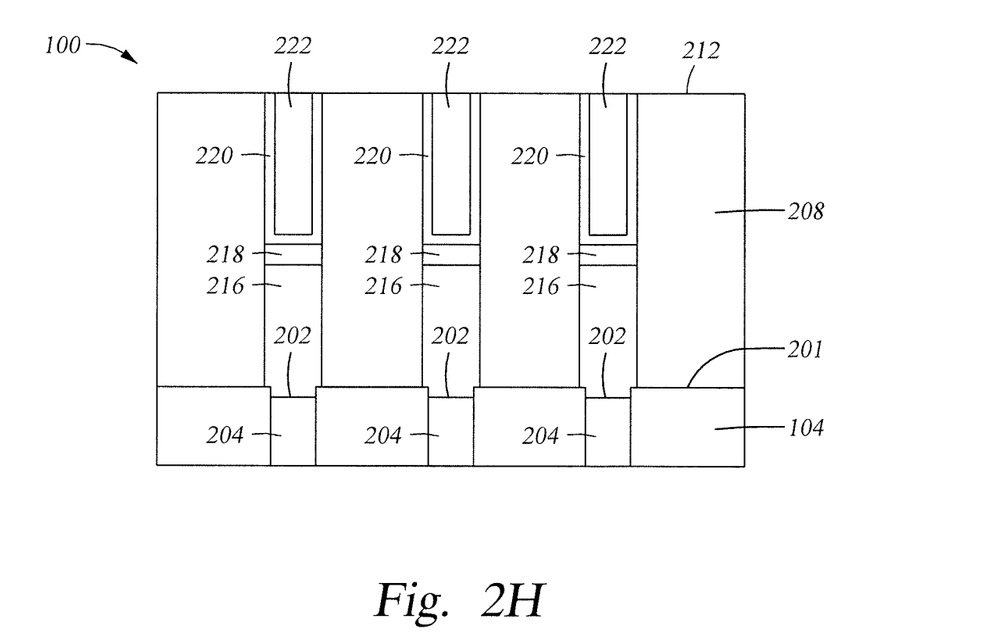

Another benefit of forming the plurality of openings 214 is that any material deposited on the surface 213 of the fill material 216 within the opening 214 is self-aligned. In one embodiment, a metal contact 222 is deposited over the fill material 216 within the opening 214, as shown in FIG. 2H. The metal contact 222 is self-aligned to the fill material 216, i.e., a source or drain, since both the metal contact 222 and the fill material 216 are formed within the opening 214. The metal contact 222 may be fabricated from a metal such as cobalt or tungsten. Additional materials may be formed on the fill material 216 prior to the deposition of the metal contact 222. For example, a silicide or germanide layer 218 may be formed on the fill material 216 by a silicidation process. A liner 220 may be formed conformally in the opening 214 by an atomic layer deposition (ALD) process. The metal contact 222 is then deposited on the liner 220. A CMP process may be performed to planarize the surface.

In some embodiments, one suitable apparatus for performing the etching process is the CENTURA™ RP Epi platform available from Applied Materials, Inc., Santa Clara, Calif. It is contemplated that other suitably configured apparatus from other manufacturers may also be utilized in accordance with the embodiments described herein. As aforementioned, selective etching is utilized to remove the III-V structures. For example, etch chemistries selective to III-V materials are utilized to remove the features 206 preferentially to the oxide and/or nitride containing gap fill material. The etching operation may be performed in the same chamber as the deposition operation.

In some embodiments, a chlorine containing gas, such as HCl, is used as an etchant. The chlorine containing gas is optionally delivered to a substrate processing environment with a hydrogen containing gas, such as $H_2$. In some embodiments, the chlorine containing gas is optionally delivered to a substrate processing environment with a relatively nonreactive carrier gas such as $N_2$ or Ar. In one example, the HCl is delivered to the substrate processing environment at a flow rate of between about 1 sccm and about 500 sccm, for a 300 mm wafer. The nonreactive carrier gas is delivered to the substrate processing environment at a flow rate of between about 1 slm and about 20 slm. A temperature of the wafer is maintained between about 300° C. and about 800° C. and a pressure of the substrate processing environment is maintained between about 0 Torr and about 100 Torr.

HCl is used instead of a mixture of HCl and $H_2O$ because $H_2O$ oxidizes the surface of the silicon surfaces. Using an HCl etch gas with a mass flow of 1-500 sccm at low temperatures (less than about 800° C.) reduces the damage to the Si, $SiO_x$ and $SiN_x$ materials. Moreover, using low pressure etch processes (less than about 100 Torr) allows the gas to reach the bottom of the deep trenches of the high aspect ratio features.

Figure 3A:
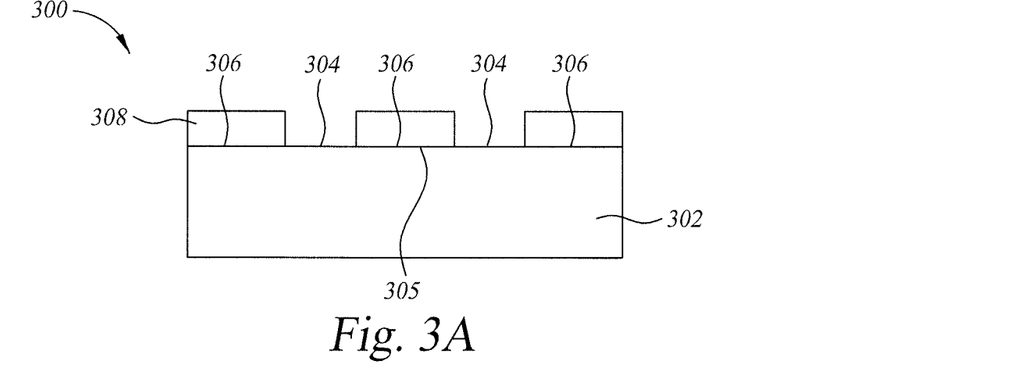
FIGS. 3A-3C illustrate a process for forming a semiconductor device according to another embodiment described herein.
Figure 3B:
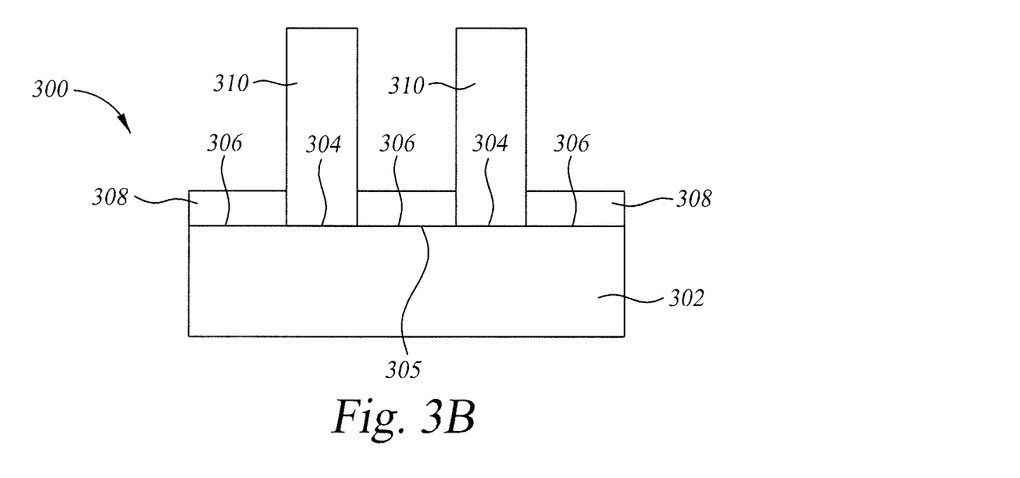
Figure 3C:
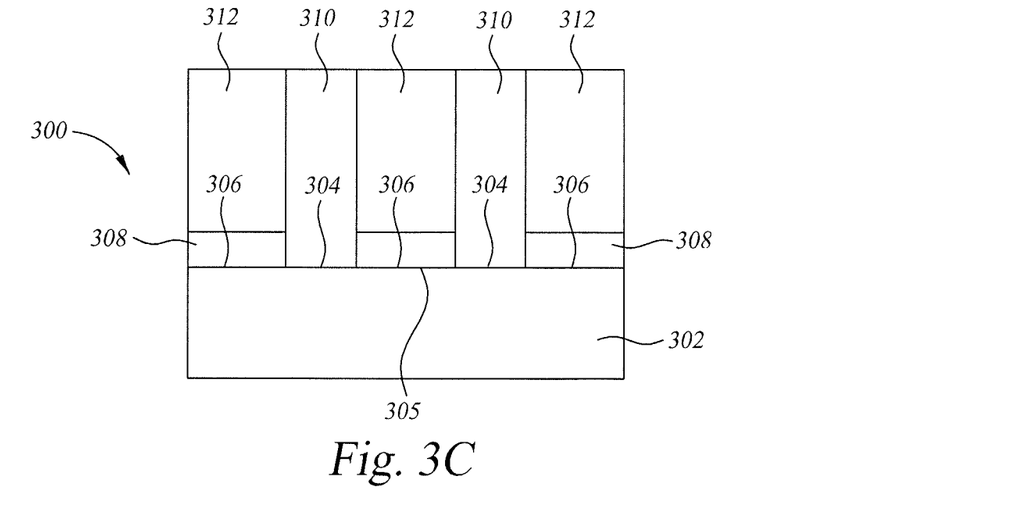

FIGS. 3A-3C illustrate a process for forming a semiconductor device according to another embodiment described herein. FIG. 3A is a side view of the semiconductor structure 300. The semiconductor structure 300 includes a substrate 302 having a semiconductor surface 305. The semiconductor surface 305 includes a plurality of exposed portions 304 separated by a plurality of covered portions 306. In one embodiment, the substrate 302 is a silicon substrate, and the semiconductor surface 305 is a silicon surface. A first dielectric material 308 is disposed on the covered portions 306 of the semiconductor surface 305. The first dielectric material 308 may be silicon oxide, silicon nitride, silicon oxynitride, silicon carbonitride, or any other suitable dielectric material. Next, as shown in FIG. 3B, a feature 310 is formed on each exposed portion 304 of the semiconductor surface 305. The features 310 may be the same as the features 206. Prior to forming the features 310, any native oxides formed on the semiconductor surface 305 may be removed by a pre-clean process. The features 310 may be formed in an epitaxial deposition chamber. In one embodiment, each feature 310 is formed in by first forming a nucleation layer on a corresponding exposed portion 304 of the semiconductor surface 305. The nucleation layer and the features 310 may be formed under the same process conditions as the nucleation layer and the features 206. Unlike the silicon or germanium based materials, which form a diamond shape due to the different growth rate on different surface planes, the materials used to form the features 310 do not form a diamond shape. The height, width and facets of the features 310 can be controlled by temperature, pressure and/or precursor flow.

Next, as shown in FIG. 3C, a second dielectric material 312 is formed between adjacent features 310. In one embodiment, the second dielectric material 312 and the features 310 are coplanar at the end of the deposition process of the second dielectric material 312. In another embodiment, the second dielectric material 312 is also formed on the features 310 and a CMP process is performed on the second dielectric material 312 to expose the features 310. The second dielectric material 312 may be the same material as the dielectric material 208.

Process operations shown in FIGS. 2F, 2G and 2H are then performed on the semiconductor structure 300 to form a plurality of openings in the second dielectric material 312, to deposit a fill material in the plurality of openings, and to deposit a metal in the plurality of openings. The fill material may be the same as the fill material 216, and the metal may be the same as the metal contact 222. The fill material and the metal are self-aligned since both materials are formed within the same opening.

Figure 4A:
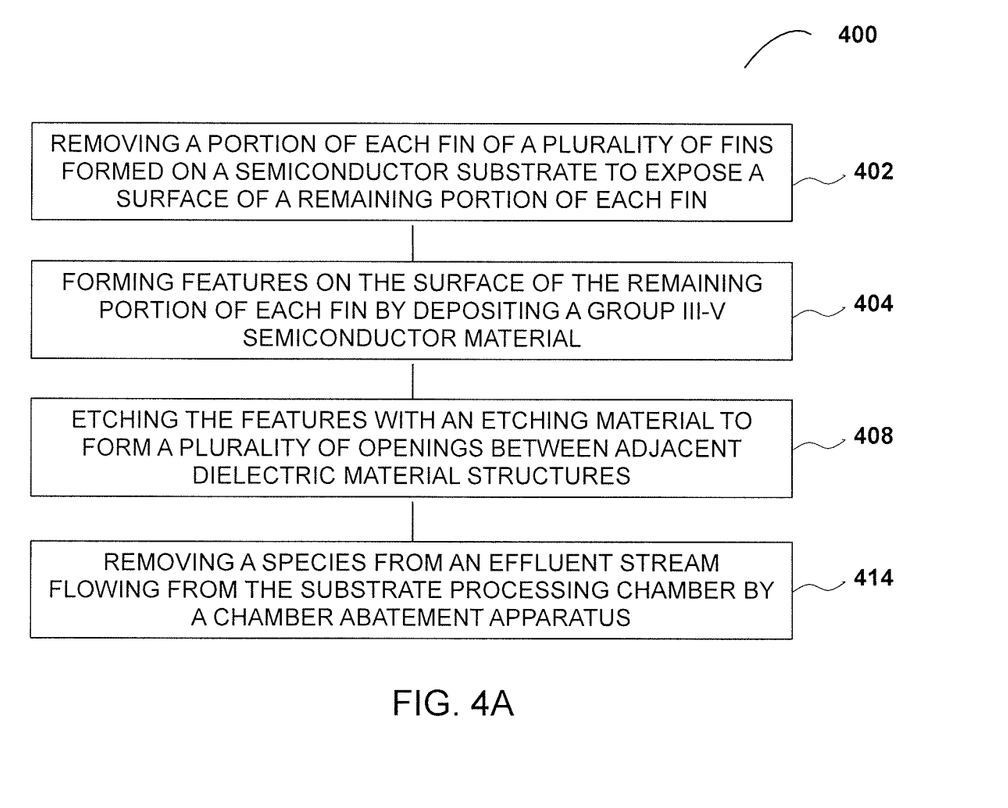
FIG. 4A illustrates operations of a method for fin structure processing according to some embodiments.

A fin structure processing method is described herein, and is described above. FIG. 4A illustrates operations of a method 400 for fin structure processing according to some embodiments. The method 400 includes removing a portion of a first fin of a plurality of fins formed on a semiconductor substrate to expose a surface of a remaining portion of the first fin, wherein the fins are adjacent to dielectric material structures formed on the semiconductor substrate at operation 402. Method 400 further includes forming features on the surface of the remaining portion of the first fin by depositing a Group III-V semiconductor material in a substrate processing environment at operation 404. The method 400 further includes etching the features with an etching gas to form a plurality of openings between adjacent dielectric material structures at operation 408. In some embodiments, the etching gas is a chlorine containing gas. In some embodiments, the etching gas is delivered to the substrate processing environment with a hydrogen containing gas and/or a carrier gas, as described above.

Figure 4B:
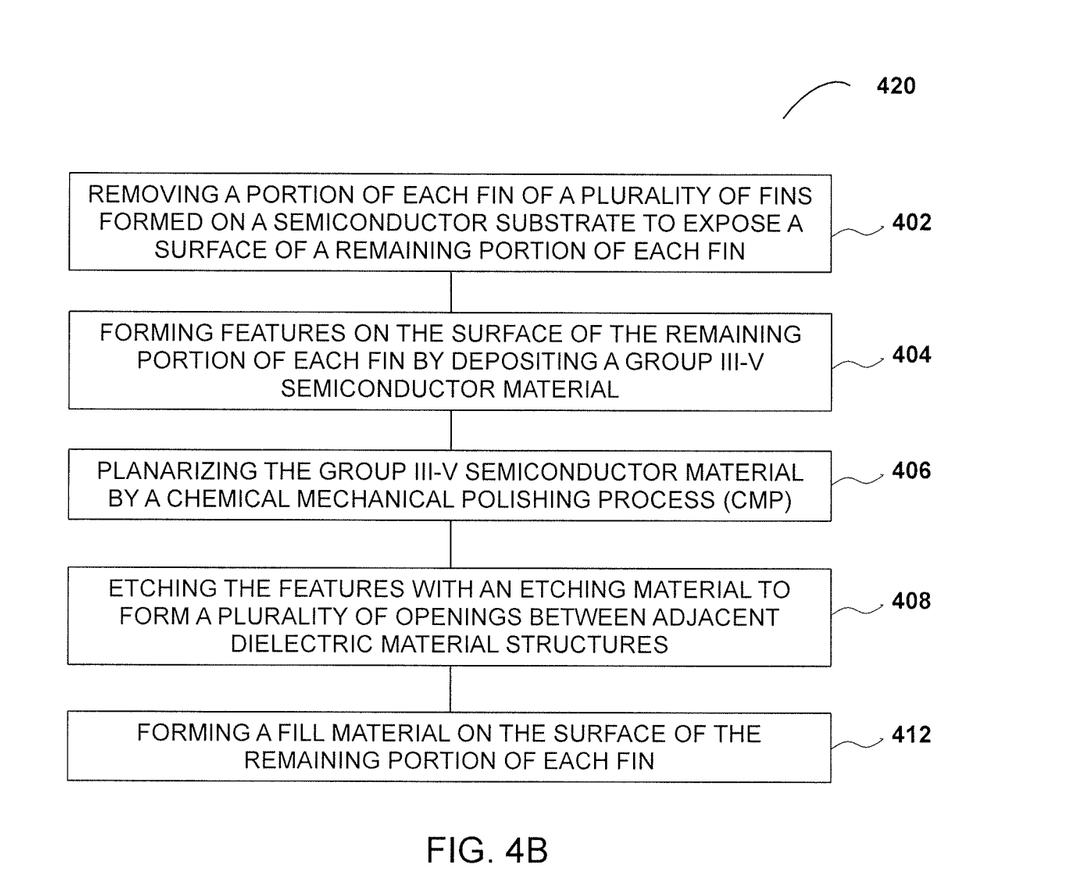
FIG. 4B illustrates operations of a method for fin structure processing according to some embodiments.

A fin structure processing method is described herein, and is described above. FIG. 4B illustrates operations of a method 420 for fin structure processing according to some embodiments. The method 420 includes removing a portion of a first fin of a plurality of fins formed on a semiconductor substrate to expose a surface of a remaining portion of the first fin, wherein the fins are adjacent to dielectric material structures formed on the semiconductor substrate at operation 402. Method 420 further includes forming features on the surface of the remaining portion of the first fin by depositing a Group III-V semiconductor material in a substrate processing environment at operation 404. The method 420 further includes planarizing the Group III-V semiconductor material by a chemical mechanical polishing process (CMP) at operation 406. The method 420 further includes etching the features with an etching gas to form a plurality of openings between adjacent dielectric material structures at operation 408. In some embodiments, the etching gas is a chlorine containing gas. In some embodiments, the etching gas is delivered to the substrate processing environment with a hydrogen containing gas and/or a carrier gas. The method 420 further includes forming a fill material on the surface of the remaining portion of the first fin, wherein the fill material is formed within a corresponding opening of the plurality of openings at operation 412.

Figure 4C:
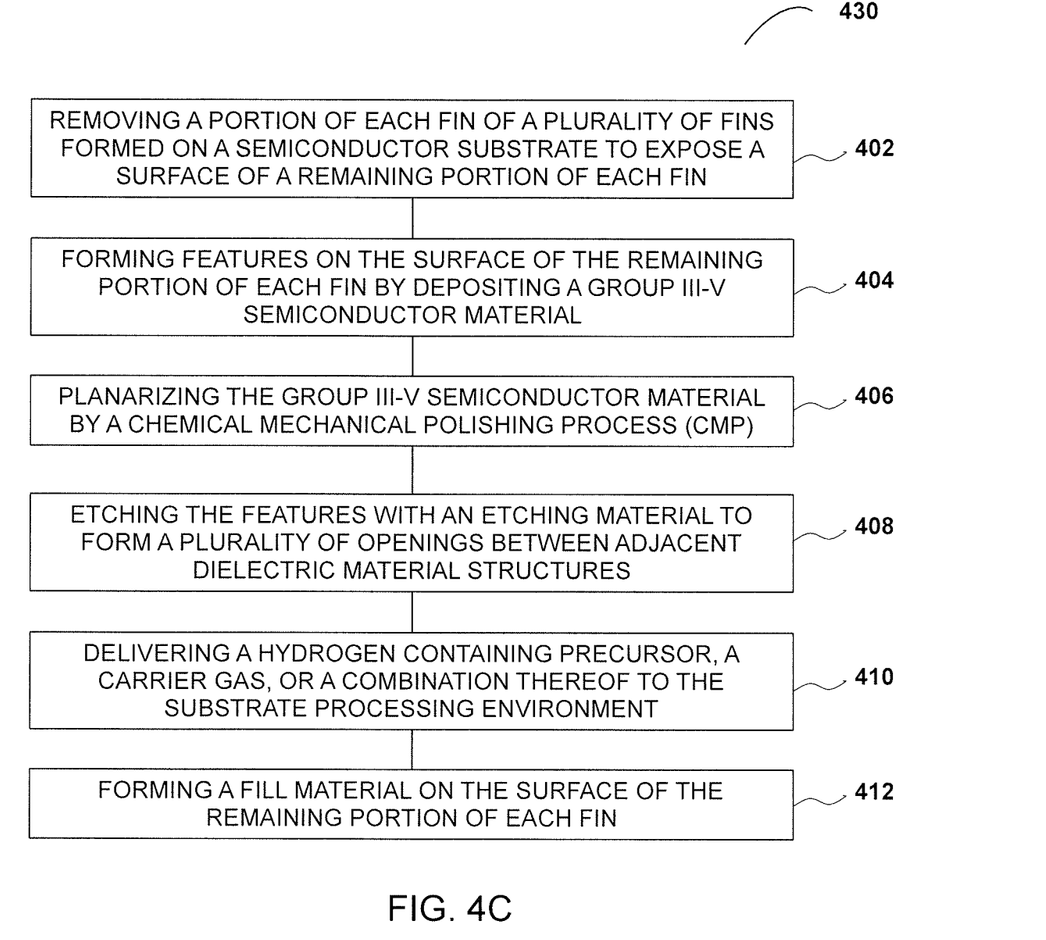
FIG. 4C illustrates operations of a method for fin structure processing according to some embodiments.

A fin structure processing method is described herein, and is described above. FIG. 4C illustrates operations of a method 430 for fin structure processing according to some embodiments. The method 430 includes removing a portion of a first fin of a plurality of fins formed on a semiconductor substrate to expose a surface of a remaining portion of the first fin, wherein the fins are adjacent to dielectric material structures formed on the semiconductor substrate at operation 402. Method 430 further includes forming features on the surface of the remaining portion of the first fin by depositing a Group III-V semiconductor material in a substrate processing environment at operation 404. The method 430 further includes planarizing the Group III-V semiconductor material by a chemical mechanical polishing process at operation 406. The method 430 further includes etching the features with an etching gas to form a plurality of openings between adjacent dielectric material structures at operation 408. In some embodiments, the etching gas is a chlorine containing gas. The method 430 delivering a hydrogen containing gas, a carrier gas, or a combination thereof to the substrate processing environment at operation 410. The method 430 further includes forming a fill material on the surface of the remaining portion of the first fin, wherein the fill material is formed within a corresponding opening of the plurality of openings at operation 412.

In some embodiments, the III-V growth chamber is connected to a chamber abatement apparatus. The chamber abatement apparatus includes an absorber that can be used for abatement of a species, such as an arsenic containing material. The chamber abatement apparatus allows removing arsenic, for example, from the effluent stream flowing from the substrate processing chamber. Conventional etch tools do not have a dedicated abatement apparatus. Therefore, unlike conventional etch tools, the use of the III-V growth chamber for etch avoids contamination and abatement issues because the III-V growth chamber is equipped with a chamber abatement apparatus that is connected to the effluent flowing from the substrate processing chamber.

Therefore and in some embodiments the method 400 includes removing a species (such as an arsenic containing material) from an effluent stream flowing from the substrate processing chamber by a chamber abatement apparatus at operation 414. In some embodiments, the chamber abatement apparatus includes an absorber.

While the foregoing is directed to embodiments of the disclosure, other and further embodiments may be devised without departing from the basic scope thereof, and the scope thereof is determined by the claims that follow.

What is claimed is:

1. A fin structure processing method, comprising:
  removing a portion of a first fin of a plurality of fins formed on a substrate to expose a surface of a remaining portion of the first fin, wherein the fins are adjacent to dielectric material structures formed on the substrate;
  performing a deposition operation to form features on the surface of the remaining portion of the first fin by depositing a Group III-V semiconductor material in a substrate processing environment; and
  performing an etching operation to etch the features with an etching gas to form a plurality of openings between adjacent dielectric material structures, wherein the etching operation is performed in the same chamber as the deposition operation, wherein a temperature of the substrate is between about 300° C. and about 800° C., and a pressure of the substrate processing environment is between about 1 Torr and about 100 Torr during at least a portion of the etching operation.

2. The method of claim 1, further comprising planarizing the Group III-V semiconductor material by a chemical mechanical polishing process.

3. The method of claim 1, wherein the substrate processing environment is an epitaxial deposition chamber.

4. The method of claim 3, wherein the etching gas is a chlorine containing gas.

5. The method of claim 4, wherein the chlorine containing gas is HCl.

6. The method of claim 1, further comprising forming a fill material on the surface of the remaining portion of the first fin, wherein the fill material is formed within a corresponding opening of the plurality of openings.

7. The method of claim 1, wherein the etching gas is delivered to the substrate processing environment at a flow rate of between about 1 sccm and about 500 sccm, for a 300 mm wafer.

8. The method of claim 1, wherein the etching gas is delivered to the substrate processing environment with a hydrogen containing gas, a carrier gas, or combinations thereof.

9. The method of claim 8, wherein the carrier gas is $N_2$ or Ar.

10. The method of claim 9, wherein the carrier gas is delivered to the substrate processing environment at a flow rate of between about 1 slm and about 20 slm.

11. The method of claim 1, further comprising removing a species from an effluent stream flowing from the substrate processing environment by a chamber abatement apparatus.

12. A fin structure processing method, comprising:
removing a portion of a first fin of a plurality of fins formed on a substrate to expose a surface of a remaining portion of the first fin, wherein the fins are adjacent to dielectric material structures formed on the substrate;
performing a deposition operation to form features on the surface of the remaining portion of the first fin by depositing a Group III-V semiconductor material in a substrate processing environment;
planarizing the Group III-V semiconductor material by a chemical mechanical polishing process;
performing an etching operation to etch the features with an etching gas to form a plurality of openings between adjacent dielectric material structures, wherein the etching operation is performed in the same chamber as the deposition operation, and wherein the etching qas is delivered to the substrate processing environment with a hydrogen containing gas, a carrier gas, or combinations thereof; and
forming a fill material on the surface of the remaining portion of the first fin, wherein the fill material is formed within a corresponding opening of the plurality of openings.

13. The method of claim 12, wherein the etching gas is a chlorine containing gas.

14. The method of claim 13, wherein the chlorine containing gas is HCl.

15. The method of claim 12, wherein the features are formed in an epitaxial deposition chamber.

16. The method of claim 12, wherein the carrier gas is $N_2$ or Ar.

17. A fin structure processing method, comprising:
removing a portion of a first fin of a plurality of fins formed on a substrate to expose a surface of a remaining portion of the first fin, wherein the fins are adjacent to dielectric material structures formed on the substrate;
performing a deposition operation to form features on the surface of the remaining portion of the first fin by depositing a Group III-V semiconductor material in a substrate processing environment;
planarizing the Group III-V semiconductor material by a chemical mechanical polishing process;
performing an etching operation to etch the features with an etching gas to form a plurality of openings between adjacent dielectric material structures, wherein the etching operation is performed in the same chamber as the deposition operation and wherein the etching gas is HCl;
delivering a hydrogen containing gas, a carrier gas, or a combination thereof, to the substrate processing environment; and
forming a fill material on the surface of the remaining portion of the first fin, wherein the fill material is formed within a corresponding opening of the plurality of openings.

18. The method of claim 17, wherein the carrier gas is $N_2$ or Ar.

19. A fin structure processing method, comprising:
removing a portion of a first fin of a plurality of fins formed on a substrate to expose a surface of a remaining portion of the first fin, wherein the fins are adjacent to dielectric material structures formed on the substrate;
performing a deposition operation to form features on the surface of the remaining portion of the first fin by depositing a Group III-V semiconductor material in a substrate processing environment; and performing an etching operation to etch the features with an etching gas to form a plurality of openings between adjacent dielectric material structures, wherein the etching operation is performed in the same chamber as the deposition operation; and
removing a species from an effluent stream flowing from the substrate processing environment by a chamber abatement apparatus.

20. The method of claim 19, wherein:
the etching gas is a chlorine containing gas;
the etching gas is delivered to the substrate processing environment with a hydrogen containing gas, $N_2$, Ar, or a combination thereof; and
the etching gas is delivered to the substrate processing environment at a flow rate of between about 1 sccm and about 500 sccm, for a 300 mm wafer.

* * * * *